US012356576B2

(12) United States Patent
Hsieh et al.

(10) Patent No.: US 12,356,576 B2
(45) Date of Patent: Jul. 8, 2025

(54) SERVER AND EXPANSION CAGE ASSEMBLY

(71) Applicants:INVENTEC (PUDONG) TECHNOLOGY CORPORATION, Shanghai (CN); INVENTEC CORPORATION, Taipei (TW)

(72) Inventors: Han-Chih Hsieh, Taipei (TW); Chih-Lung Liao, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 210 days.

(21) Appl. No.: 18/242,433

(22) Filed: Sep. 5, 2023

(65) Prior Publication Data
US 2024/0414871 A1    Dec. 12, 2024

(30) Foreign Application Priority Data
Jun. 7, 2023    (CN) .......................... 202310671846.7

(51) Int. Cl.
*H05K 7/14*    (2006.01)
(52) U.S. Cl.
CPC ................... *H05K 7/1489* (2013.01)
(58) Field of Classification Search
None
See application file for complete search history.

(56) References Cited

U.S. PATENT DOCUMENTS

| 9,706,677 | B2 * | 7/2017 | Cravens | H05K 7/1489 |
| 10,042,396 | B1 * | 8/2018 | Gupta | G05B 19/0421 |
| 10,168,747 | B2 * | 1/2019 | Zhu | H05K 7/1489 |
| 10,237,965 | B2 * | 3/2019 | Luskind | G06F 1/182 |
| 10,251,300 | B1 * | 4/2019 | Mao | H05K 7/1487 |
| 10,863,644 | B1 * | 12/2020 | Tseng | H05K 7/1487 |
| 10,917,993 | B1 * | 2/2021 | Sung | H05K 7/20581 |
| 11,178,787 | B2 * | 11/2021 | Peng | H05K 5/0247 |
| 11,310,932 | B2 * | 4/2022 | Chang | H05K 7/16 |
| 11,683,904 | B2 * | 6/2023 | Chang | H05K 7/1489 361/679.02 |
| 2015/0241945 | A1 * | 8/2015 | Dube | H05K 7/1492 713/320 |

* cited by examiner

*Primary Examiner* — Xanthia C Relford
(74) *Attorney, Agent, or Firm* — Maschoff Brennan

(57) ABSTRACT

An expansion cage assembly is configured to be installed onto two mounting plates, and is configured for an installation of an expansion card. The expansion cage assembly includes a supporting member, two side boards, a plurality of partitions and at least one expansion cage. The two side boards are connected to two opposite sides of the supporting member, respectively, and are detachably disposed the two mounting plates, respectively. The plurality of partitions are connected to the supporting member, and are disposed between the two side boards. The plurality of partitions are spaced apart from one another. The at least one expansion cage is disposed on one of the two side boards and the plurality of partitions.

10 Claims, 9 Drawing Sheets

SERVER AND EXPANSION CAGE ASSEMBLY

CROSS-REFERENCE TO RELATED APPLICATIONS

This non-provisional application claims priority under 35 U.S.C. § 119 (a) on Patent Application No(s). 202310671846.7 filed in China, on Jun. 7, 2023, the entire contents of which are hereby incorporated by reference.

BACKGROUND OF THE INVENTION

Technical Field of the Invention

The invention relates to a server and an expansion cage assembly, more particularly to a server and an expansion cage assembly connecting expansion cards and a motherboard via cables.

Description of the Related Art

In a server, expansion cards provide several functions, such as image processing, network interface, peripheral device interface and data storage. Users may install one or more expansion cards in the server according to their own needs so as to expand the function of the server.

However, it is difficult for an expansion card to be electrically connected to the motherboard of a conventional server by the use a golden finger due to the interior structure of the server. That is, the expansion card is difficult to be mounted in the conventional server. Therefore, how to improve the convenience of installing expansion cards in the servers and ensuring their electrical connection to the motherboard is an important issue to be solved.

SUMMARY OF THE INVENTION

The invention provides a server and an expansion cage assembly so as to improve the convenience of installing expansion cards in servers and ensuring their electrical connection to the motherboard.

One embodiment of the invention provides a server including a casing, a motherboard, an expansion cage assembly and at least one expansion card. The casing includes a bottom plate, two side plates and two mounting plates. The two side plates are connected to two opposite sides of the bottom plate, respectively. The two mounting plates are mounted to the two side plates, respectively. The motherboard is disposed on the bottom plate of the casing. The expansion cage assembly includes a supporting member, two side boards, a plurality of partitions and at least one expansion cage. The two side boards are connected to two opposite sides of the supporting member, respectively, and are detachably disposed on the two mounting plates, respectively. The plurality of partitions are connected to the supporting member, and are disposed between the two side boards. The plurality of partitions are spaced apart from one another. The at least one expansion cage is disposed on one of the two side boards and the plurality of partitions. The at least one expansion card is disposed on the at least one cage. The at least one expansion card is connected to the motherboard via a cable.

Another embodiment of the invention provides an expansion cage assembly configured to be installed onto two mounting plates, and is configured for an installation of an expansion card. The expansion cage assembly includes a supporting member, two side boards, a plurality of partitions and at least one expansion cage. The two side boards are connected to two opposite sides of the supporting member, respectively, and are detachably disposed on the two mounting plates, respectively. The plurality of partitions are connected to the supporting member, and are disposed between the two side boards. The plurality of partitions are spaced apart from one another. The at least one expansion cage is disposed on one of the two side boards and the plurality of partitions.

According to the server and the expansion cage assembly disclosed by the above embodiments, the side boards of the expansion cage assembly are detachably mounted on the mounting plates located at the side plates, respectively, and the expansion cards are connected to the motherboard via the cables, such that the expansion cards can be electrically connected to the motherboard of the server without the golden finger. Therefore, the convenience of installing the expansion card in the server and ensuring the electrical connection of the expansion card to the motherboard can be improved.

BRIEF DESCRIPTION OF THE DRAWINGS

The invention will become more fully understood from the detailed description given herein below and the accompanying drawings which are given by way of illustration only and thus are not limitative of the invention and wherein.

DETAILED DESCRIPTION

Figure 1:
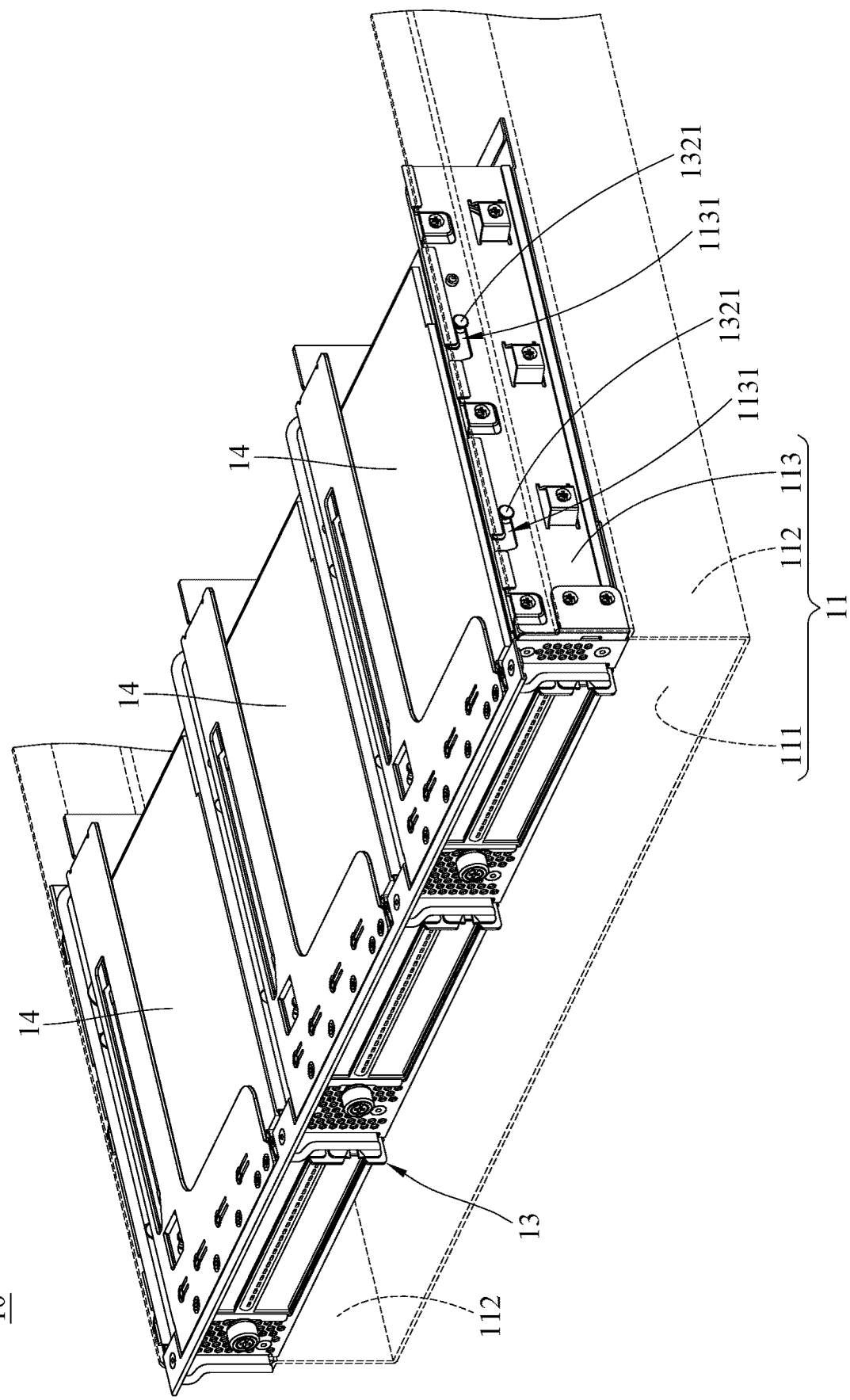
FIG. 1 is a perspective view of a server in accordance with a first embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the invention, such as technical and scientific terms, have its own meanings and can be comprehended by those skilled in the art, unless the terms are additionally defined in the invention. That is, the terms used in the following paragraphs should be read on the meaning commonly used in the related fields and will not be overly explained, unless the terms have a specific meaning in the invention.

Figure 2:
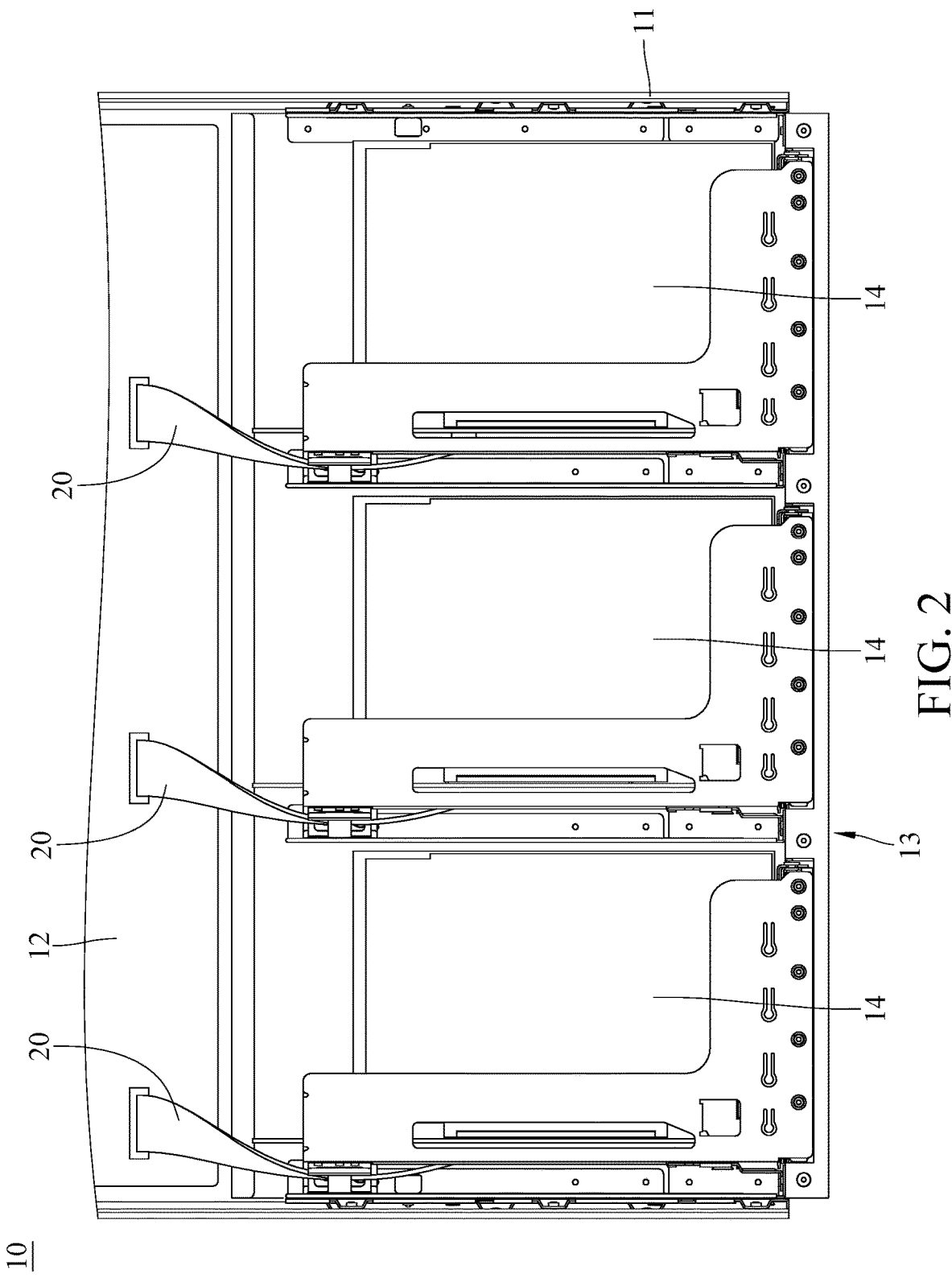
FIG. 2 is a plane view of the server in FIG. 1.
Figure 3:
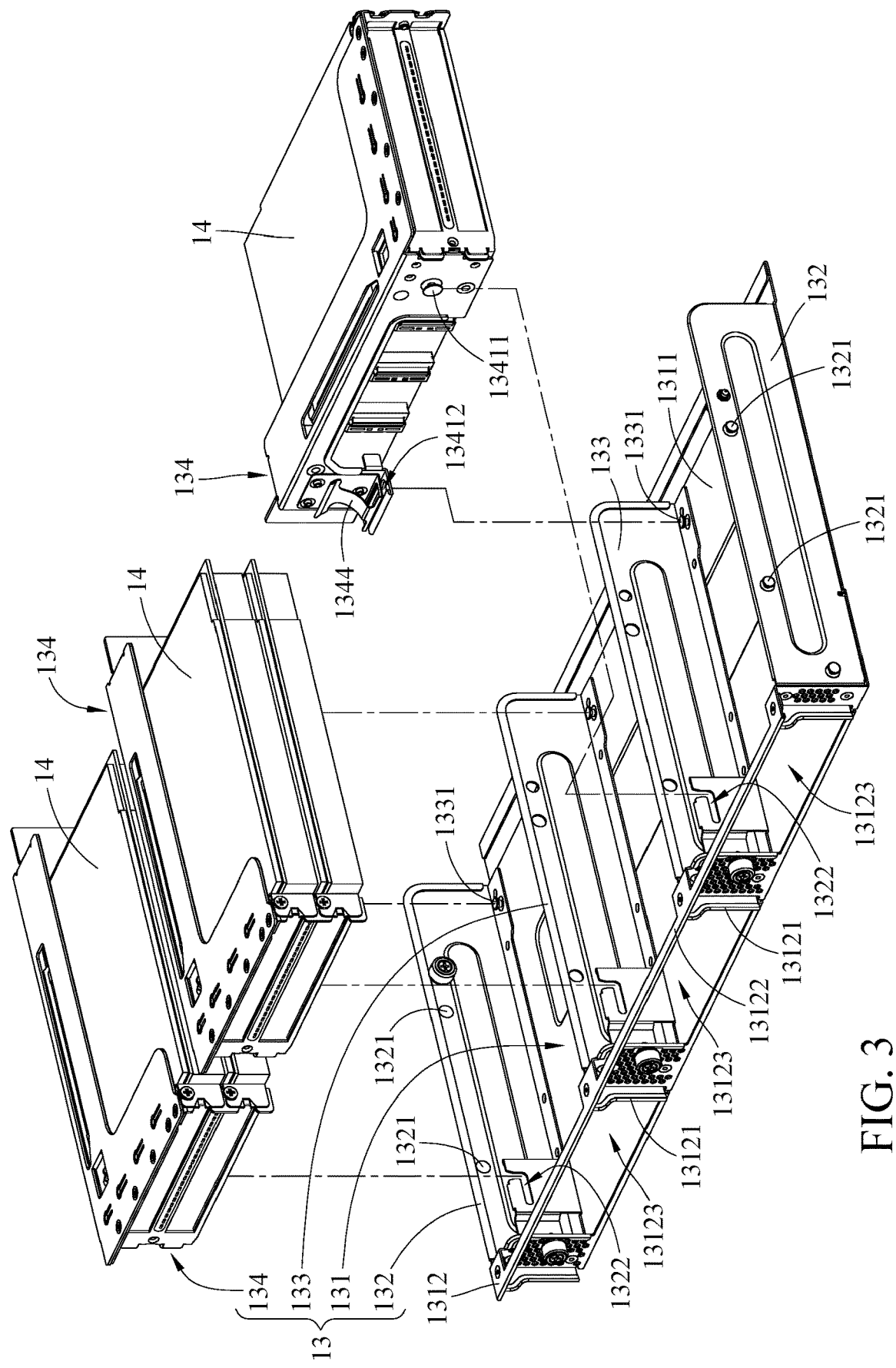
FIG. 3 is an exploded view of an expansion cage assembly of the server in FIG. 1.

Please refer to FIG. 1 to FIG. 3, where FIG. 1 is a perspective view of a server 10 in accordance with a first embodiment of the invention, FIG. 2 is a plane view of the server 10 in FIG. 1, and FIG. 3 is an exploded view of an expansion cage assembly 13 of the server 10 in FIG. 1.

In this embodiment, the server 10 includes a casing 11, a motherboard 12, an expansion cage assembly 13 and a plurality of expansion cards 14. The casing 11 includes a bottom plate 111, two side plates 112 and two mounting plates 113. A height of each side plate 112 is, for example, 2 U. The two side plates 112 are connected to two opposite sides of the bottom plate 111, respectively. The two mounting plates 113 are mounted to the two side plates 112, respectively. The motherboard 12 is mounted to the bottom plate 111 of the casing 11.

Figure 4:
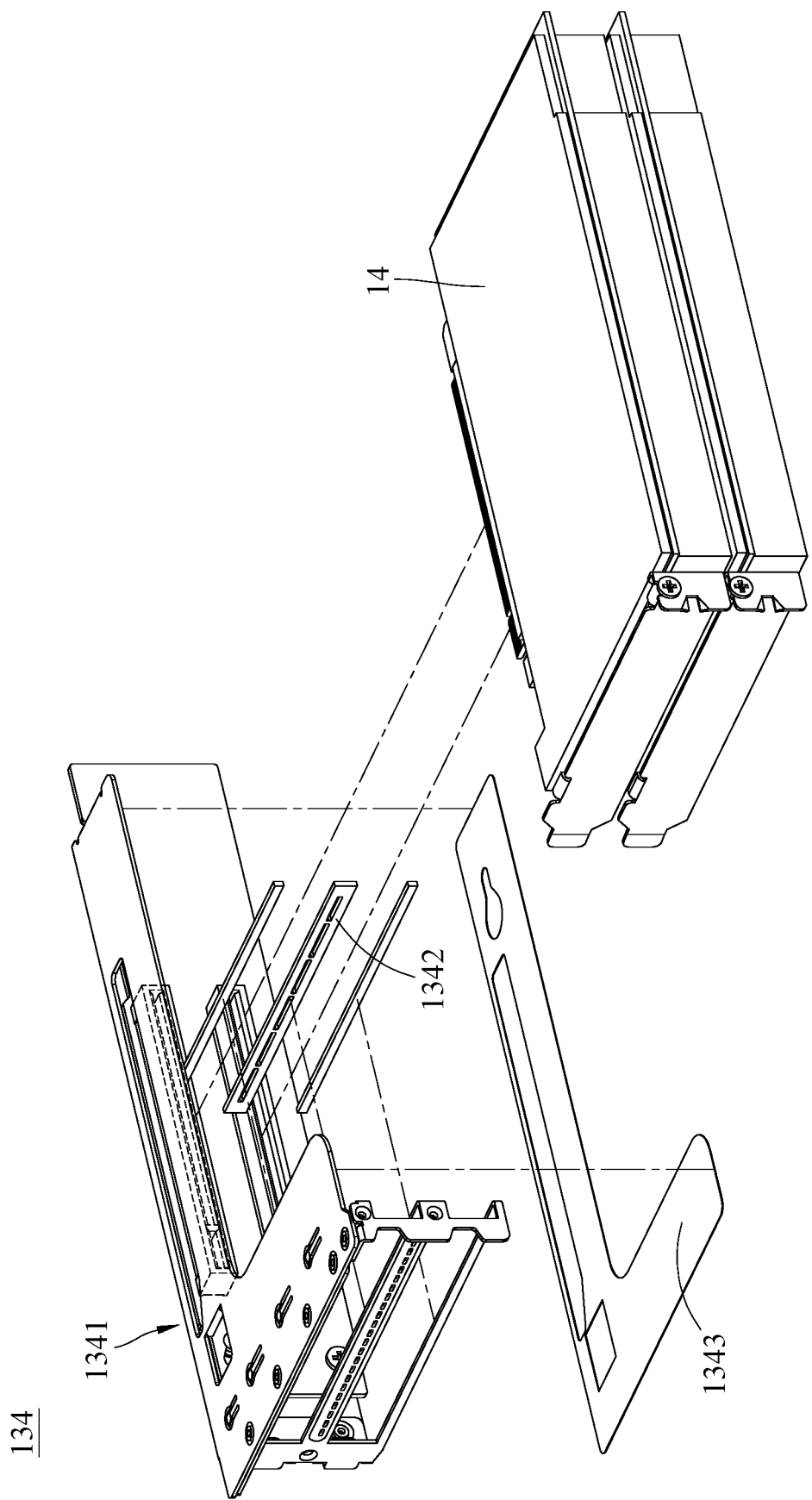
FIG. 4 is an exploded view of an expansion cage of the expansion cage assembly of the server in FIG. 1.

Please refer to FIG. 1 to FIG. 4, where FIG. 4 is an exploded view of an expansion cage 134 of the expansion cage assembly 13 of the server 10 in FIG. 1. An orthogonal projection of the expansion cage assembly 13 on the bottom plate 111 does not overlap with an orthogonal projection of the motherboard 12 on the bottom plate 111. That is, the expansion cage assembly 13 does not cover the motherboard 12. The expansion cage assembly 13 includes a supporting member 131, two side boards 132, a plurality of partitions 133 and a plurality of expansion cages 134. The supporting member 131 has a base board 1311 and a mounting frame 1312. The mounting frame 1312 is connected to a side of the base board 1311, and is located between the two mounting plates 113. The mounting frame 1312 includes a plurality of vertical portions 13121 and a horizontal portion 13122. Ends of the vertical portions 13121 are connected to the base board 1311. Another ends of the vertical portions 13121 are connected to the horizontal portion 13122 so as to form a plurality of openings 13123 between the vertical portions 13121. The openings 13123 exposes a part of the expansion cards 14. The horizontal portion 13122 is configured to be held by a user for easier installation of the expansion cage assembly 13 into the casing 11.

The two side boards 132 are, for example, riveted to two opposite ends of the base board 1311, respectively, and are, for example, riveted to the mounting frame 1312. The two side boards 132 are, for example, arranged symmetrically. The two side boards 132 are detachably mounted to the two mounting plates 113, respectively. Each mounting plate 113 has two first mounting structures 1131. Each side board 132 has two second mounting structures 1321. The two first mounting structures 1131 and the two second mounting structures 1321 are recesses and protrusions matching each other, and the two second mounting structures 1321 are slidably disposed in the two first mounting structures 1131, respectively, so as to install the two side boards 132 of the expansion cage assembly 13 onto the two mounting plates 113 of the casing 11, respectively.

The partitions 133 are, for example, riveted to the base board 1311 and the mounting frame 1312, and are disposed between the two side boards 132. The partitions 133 are spaced apart from one another. At least part of the two side boards 132 and the partitions 133 have third mounting structures 1322 and fourth mounting structures 1331. The expansion cages 134 are disposed on the two side boards 132 and the partitions 133, respectively, and each expansion cage 134 further includes a cage body 1341. Each cage body 1341 has a fifth mounting structure 13411 and a sixth mounting structure 13412. The third mounting structures 1322 and the fifth mounting structures 13411 are recesses and protrusions matching each other. The fifth mounting structures 13411 are slidably disposed at the third mounting structures 1322, respectively. The sixth mounting structures 13412 and the fourth mounting structures 1331 are recesses and protrusions matching each other. The fourth mounting structures 1331 is slidably disposed in the sixth mounting structures 13412, respectively. Accordingly, the cage bodies 1341 can be mounted to one of the two side boards 132 and the partitions 133.

Each expansion cage 134 further includes a conductive foam 1342 and an insulating film 1343. The insulating film 1343 is made of, for example, a polyester film. The conductive foam 1342 and the insulating film 1343 are disposed on the cage body 1341, and the insulating film 1343 covers one of the expansion cards 14. The expansion cards 14 are installed into the expansion cages 134, and connected to the motherboard 12 via a plurality of cables 20. The expansion cards 14 are, for example, interface cards.

In this embodiment, each expansion cage 134 may further include a cable management clip 1344. The cable management clip 1344 is disposed on the cage body 1341, so that the cables 20 can be accommodated in the cable management clip 1344 to prevent them from becoming disorganized.

In this embodiment, the expansion cage assembly 13 includes the plurality of expansion cages 134, and the expansion cages 134 are disposed on the two side boards 132 and the partitions 133, respectively, but the invention is not limited thereto. In other embodiments, the expansion cage assembly may include one expansion cage, and the expansion cage is disposed on one of the two side boards and the partitions.

Figure 5:
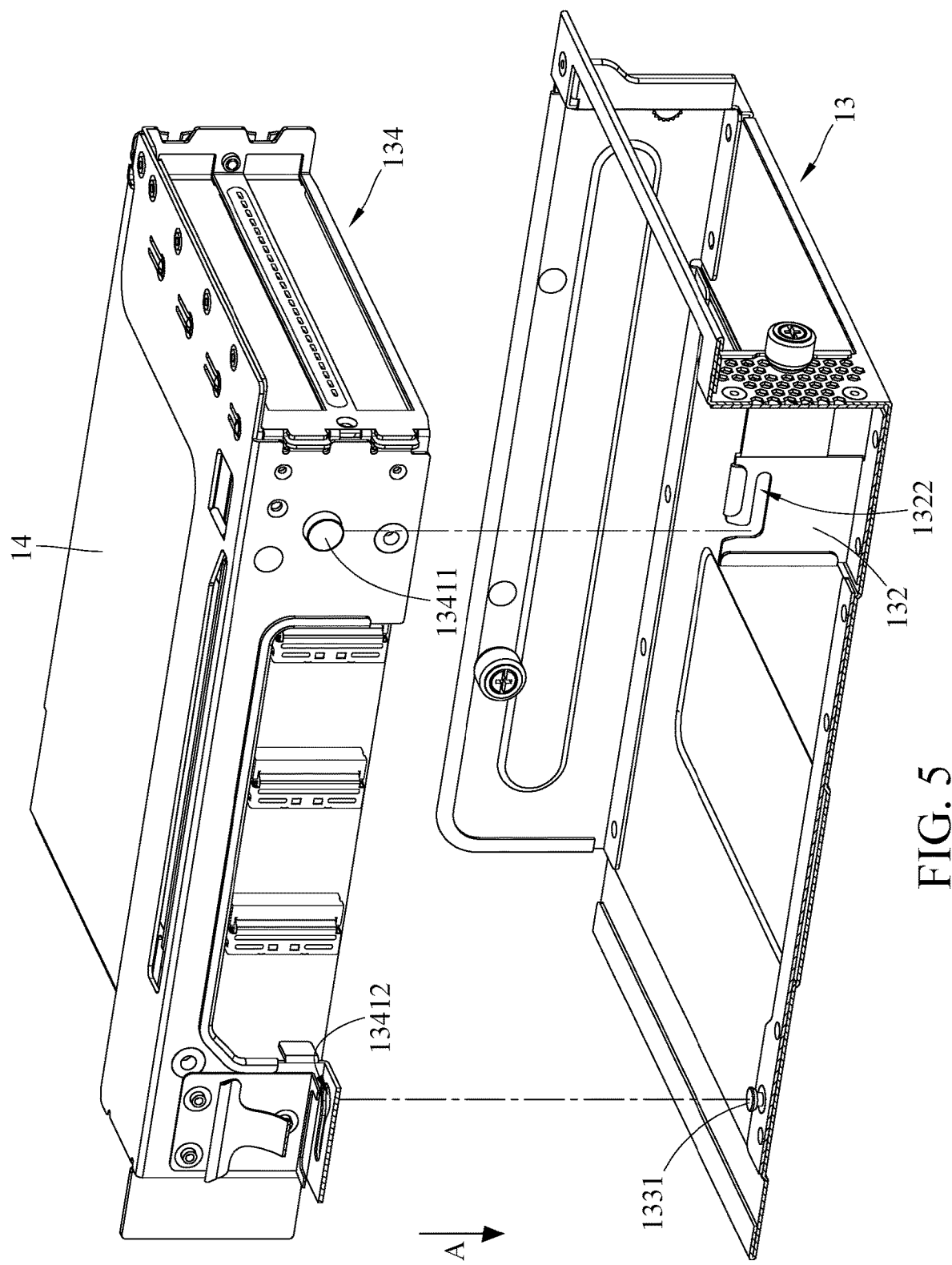
FIG. 5 is a perspective view showing that the expansion cage is not mounted to a supporting member in the server in FIG. 1.
Figure 6:
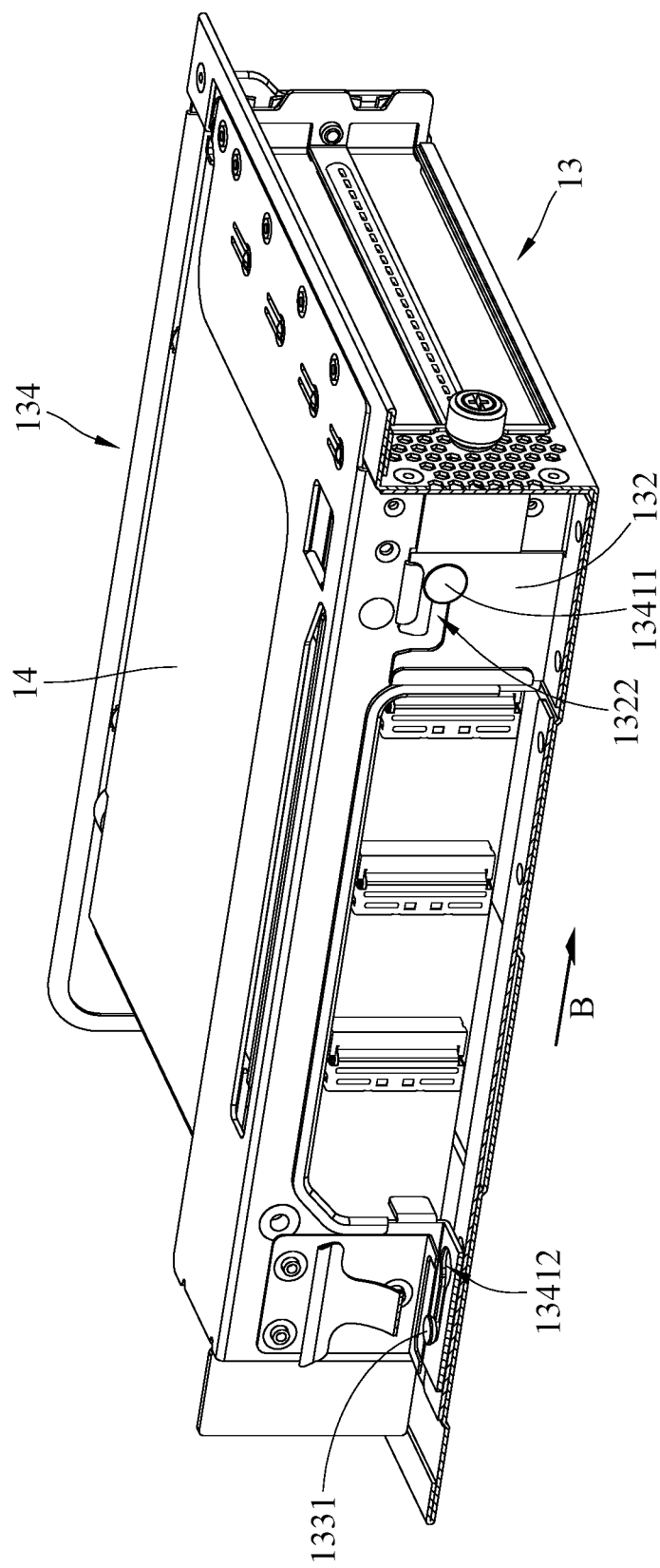
FIG. 6 is a perspective view showing that the expansion cage is mounted to the supporting member in the server in FIG. 1.
Figure 7:
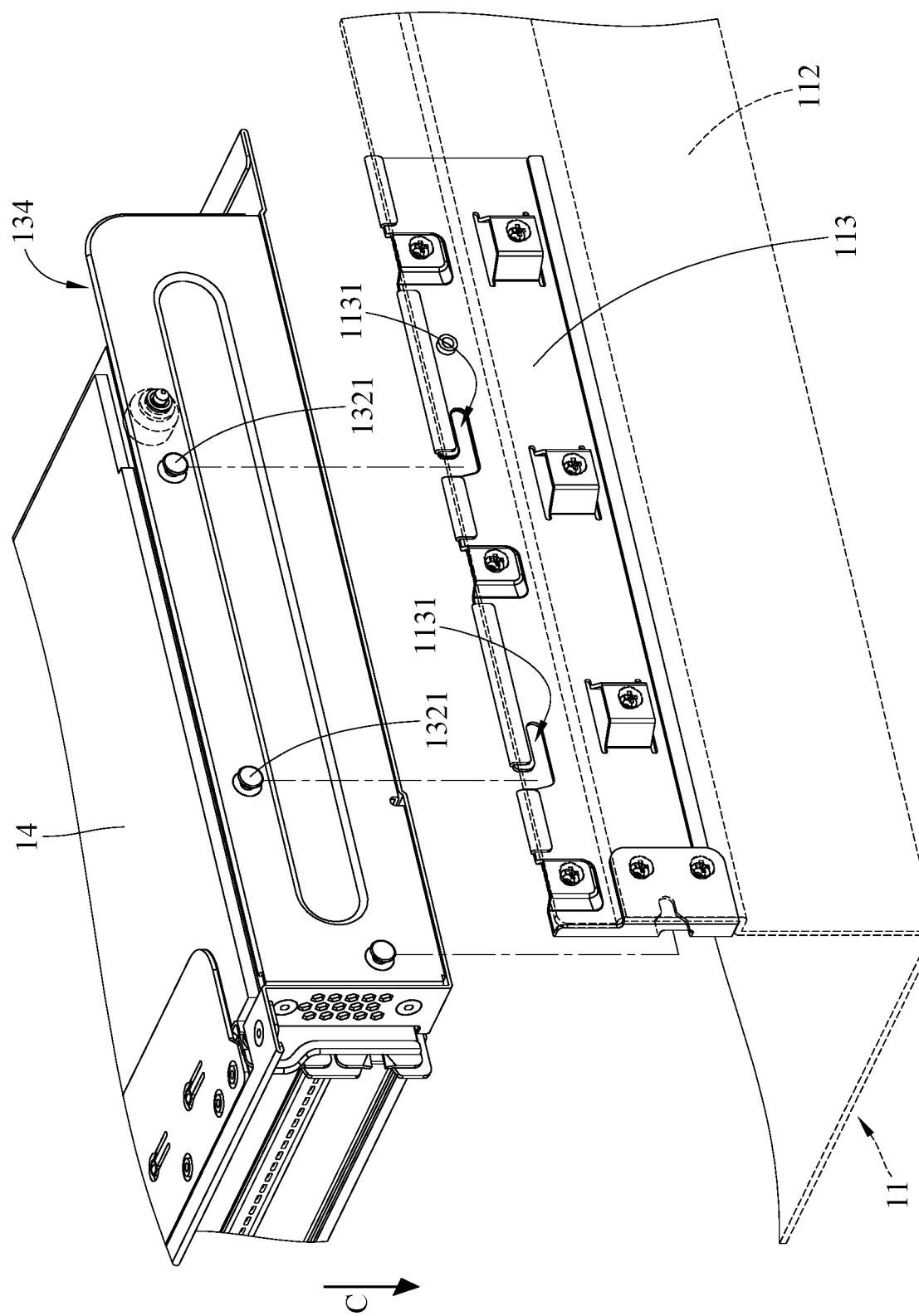
FIG. 7 is a perspective view showing that the expansion cage assembly is not mounted to a casing in the server in FIG. 1.
Figure 8:
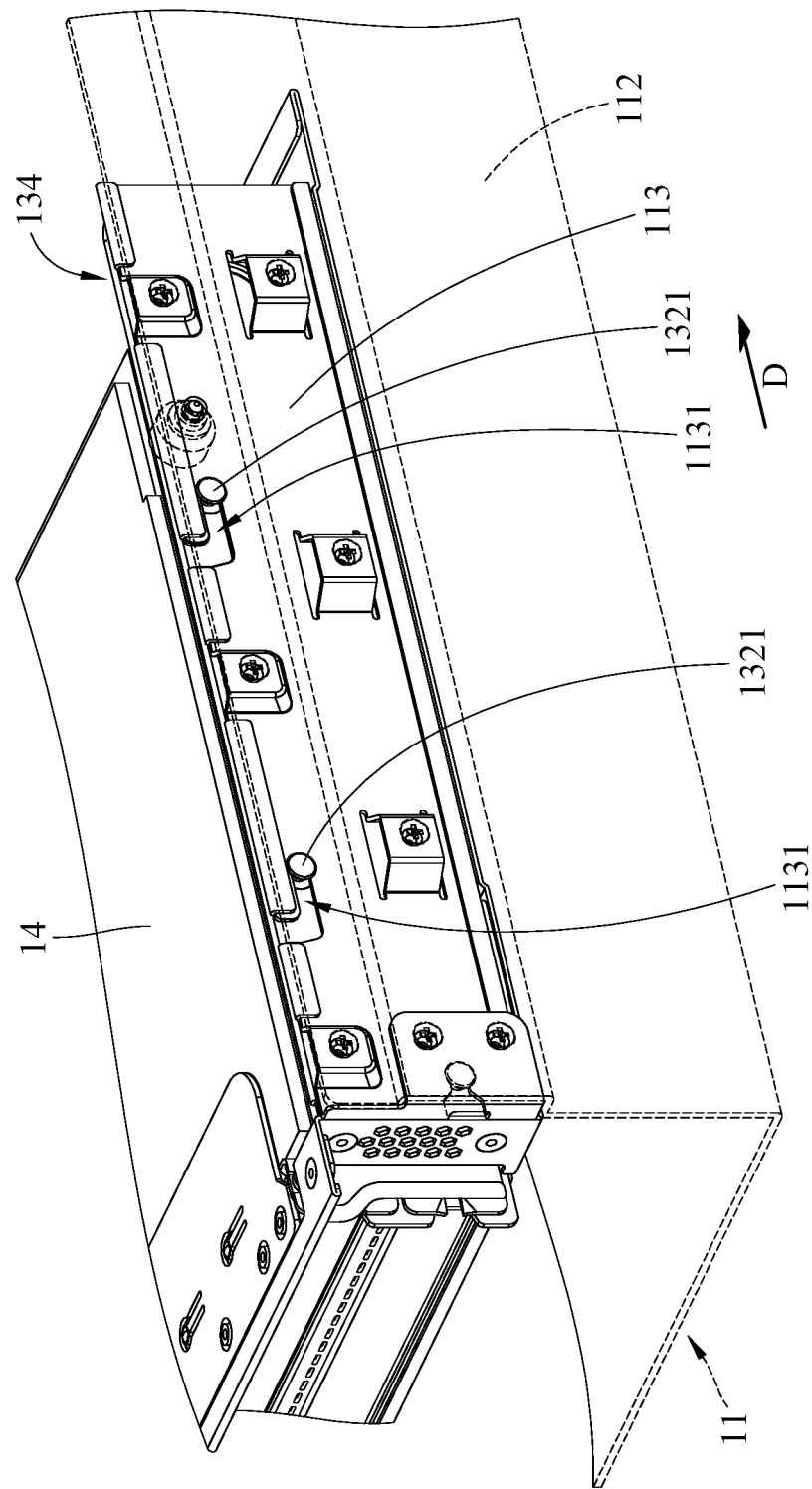
FIG. 8 is a perspective view showing that the expansion cage assembly is mounted to the casing in the server in FIG. 1.

Please refer to FIG. 5 to FIG. 8, where FIG. 5 is a perspective view showing that the expansion cage 134 is not mounted to the supporting member 131 in the server 10 in FIG. 1. FIG. 6 is a perspective view showing that the expansion cage 134 is mounted to the supporting member 131 in the server 10 in FIG. 1, FIG. 7 is a perspective view showing that the expansion cage assembly 13 is not mounted to the casing 11 in the server 10 in FIG. 1, and FIG. 8 is a perspective view showing that the expansion cage assembly 13 is mounted to the casing 11 in the server 10 in FIG. 1.

In this embodiment, as shown in FIG. 5 and FIG. 6, when the expansion cards 14 are to be installed into the casing 11, the expansion cards 14 are firstly installed onto the expansion cages 134, respectively, and the expansion cages 134 are placed into the supporting member 131 along a direction A. Then, the expansion cages 134 are moved along a direction B. At this time, the fifth mounting structures 13411 of the cage bodies 1341 are engaged with the third mounting structures 1322 of one of the two side boards 132 and the partitions 133, respectively, and the sixth mounting structures 13412 of the cage bodies 1341 are engaged with the fourth mounting structures 1331 of the two side boards 132 and the partitions 133, respectively, such that the expansion cages 134 can be fixed to the supporting member 131 so as to form the expansion cage assembly 13.

As shown in FIG. 7 and FIG. 8, then, the expansion cage assembly 13 is placed into the casing 11 along a direction C. Then, the expansion cage assembly 13 is moved along a direction D. At this time, the two second mounting structures 1321 of the two side boards 132 are engaged with the two first mounting structures 1131 of the two mounting plates 113, respectively, such that the expansion cage assembly 13 can be fixed to the casing 11.

On the contrary, when the expansion cards 14 are to be removed from the casing 11, the expansion cards 14 are firstly moved along a direction opposite to the direction D. Then, the expansion cards 14 are moved outside the casing 11 along a direction opposite to the direction C. At this time, the two second mounting structures 1321 of the two side boards 132 are disengaged from the two first mounting structures 1131 of the two mounting plates 113, respectively, such that the expansion cage assembly 13 can be separated from the casing 11.

Then, the expansion cages 134 are moved along a direction opposite to the direction B. Then, the expansion cages 134 are removed from the supporting member 131 along a direction opposite to the direction A. At this time, the fifth mounting structures 13411 of the cage bodies 1341 are disengaged from the third mounting structures 1322 of one of the two side boards 132 and the partitions 133, respectively, and the sixth mounting structures 13412 of the cage bodies 1341 are disengaged from the fourth mounting structures 1331 of the two side boards 132 and the partitions 133, respectively, such that the expansion cages 134 can be separated from the supporting member 131. Finally, the expansion cards 14 can be removed from the expansion cages 134, respectively.

Figure 9:
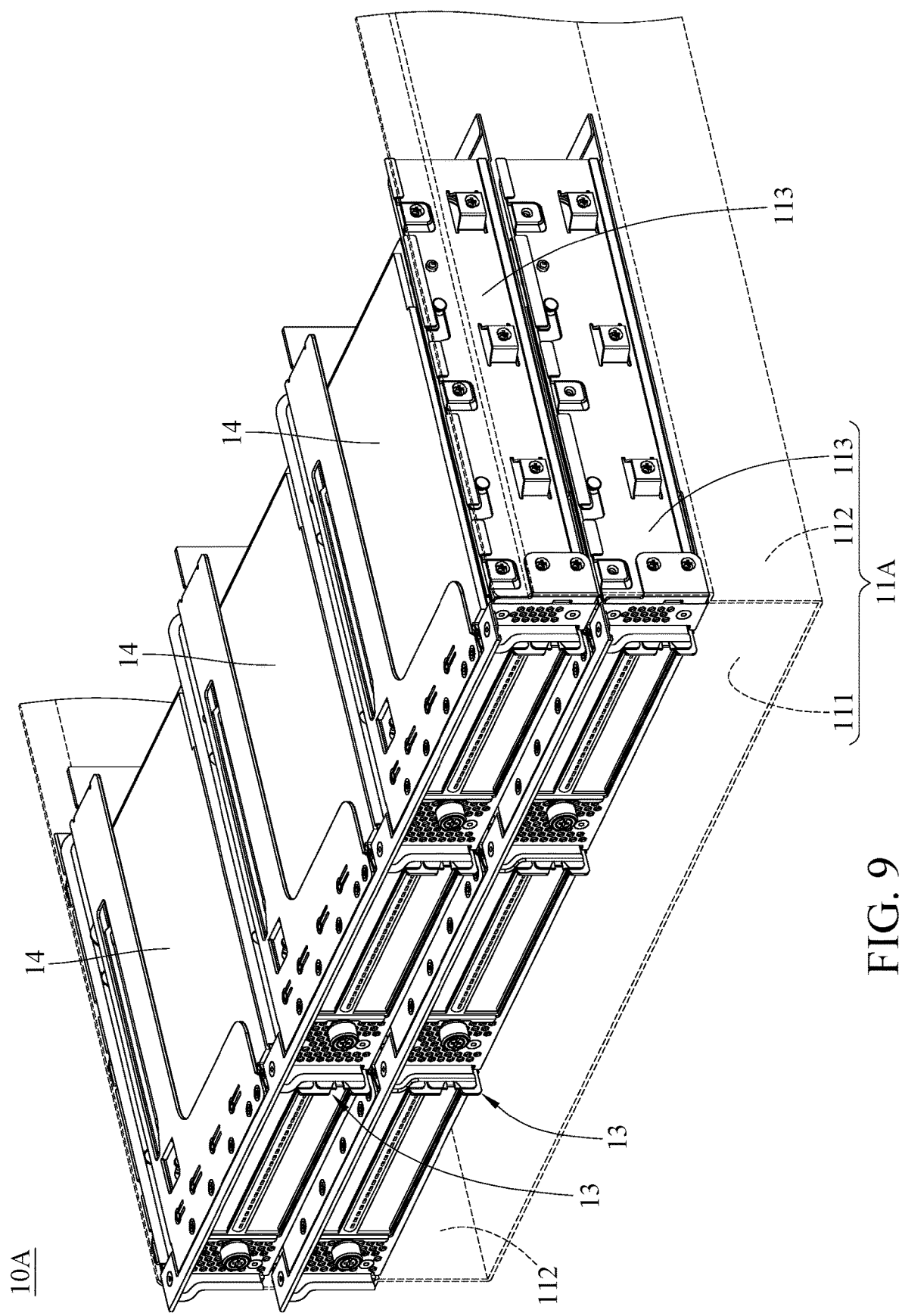
FIG. 9 is a perspective view of a server in accordance with a second embodiment of the invention.

In this embodiment, the height of each side plate 112 of the casing 11 is, for example, 2 U, and the server 10 includes one expansion cage assembly 13, but the invention is not limited thereto. Please refer to FIG. 9, which is a perspective view of a server 10A in accordance with a second embodiment of the invention. In this embodiment, a height of each side plate 112A of the server 10A is, for example, 3 U, and the server 10A may include two expansion cage assemblies 13. One expansion cage assembly 13 is stacked on the other expansion cage assembly 13.

In this embodiment, the server of the invention can be applied to artificial intelligence (AI) computing, edge computing, and can also be used as a 5G server, a cloud server or a Vehicles Internet server.

According to the server and the expansion cage assembly disclosed by the above embodiments, the side boards of the expansion cage assembly are detachably mounted on the mounting plates located at the side plates, respectively, and the expansion cards are connected to the motherboard via the cables, such that the expansion cards can be electrically connected to the motherboard of the server without the golden finger. Therefore, the convenience of installing the expansion card in the server and ensuring the electrical connection of the expansion card to the motherboard can be improved.

It will be apparent to those skilled in the art that various modifications and variations can be made to the invention. It is intended that the specification and examples be considered as exemplary embodiments only, with the scope of the invention being indicated by the following claims and their equivalents.

What is claimed is:

1. A server, comprising:
    a casing, comprising a bottom plate, two side plates and two mounting plates, wherein the two side plates are connected to two opposite sides of the bottom plate, respectively, and the two mounting plates are mounted to the two side plates, respectively;
    a motherboard, disposed on the bottom plate of the casing;
    an expansion cage assembly, comprising:
        a supporting member;
        two side boards, connected to two opposite sides of the supporting member, respectively, and detachably disposed on the two mounting plates, respectively;
        a plurality of partitions, connected to the supporting member and disposed between the two side boards, wherein the plurality of partitions are spaced apart from one another; and
        at least one expansion cage, disposed on one of the two side boards and the plurality of partitions; and
    at least one expansion card, disposed on the at least one cage, wherein the at least one expansion card is connected to the motherboard via a cable.

2. The server according to claim 1, wherein the supporting member has a base board and a mounting frame, the mounting frame is connected to a side of the base board, the mounting frame is located between the two mounting plates, and the two side boards and the plurality of partitions are riveted to the base board and the mounting frame.

3. The server according to claim 2, wherein the mounting frame comprises a plurality of vertical portions and a horizontal portion, ends of the plurality of vertical portions are connected to the base board, another ends of the plurality of vertical portions are connected to the horizontal portion to form a plurality of openings between the plurality of vertical portions, and one of the plurality of openings exposes a part of the at least one expansion card.

4. The server according to claim 1, wherein each of the two mounting plates has at least one first mounting structure, each of the two side boards has at least one second mounting structure, the at least one first mounting structure and the at least one second mounting structure are recess and protrusion matching each other, and the at least one second mounting structure is slidably disposed in the at least one first mounting structure to install the two side boards of the expansion cage assembly onto the two mounting plates of the casing, respectively.

5. The server according to claim 1, wherein the two side boards are arranged symmetrically.

6. The server according to claim 1, wherein an orthogonal projection of the expansion cage assembly on the bottom plate does not overlap with an orthogonal projection of the motherboard on the bottom plate.

7. The server according to claim 1, wherein the at least one expansion cage further comprises a cage body, a conductive foam and an insulating film, the conductive foam and the insulating film are disposed on the cage body, and the insulating film covers the at least one expansion card.

8. The server according to claim 7, wherein at least part of the two side boards and the plurality of partitions have a third mounting structure and a fourth mounting structure, respectively, the cage body has a fifth mounting structure and a sixth mounting structure, the third mounting structure and the fifth mounting structure are recess and protrusion matching each other, the fifth mounting structure is slidably disposed in the third mounting structure, the sixth mounting structure and the fourth mounting structure are recess and protrusion matching each other, and the fourth mounting structure is slidably disposed in the sixth mounting structure to install the cage body onto one of the two side boards and the plurality of partitions.

9. The server according to claim 7, wherein the at least one expansion cage further comprises a cable management clip, and the cable management clip is disposed on the cage body.

10. An expansion cage assembly, configured to be installed onto two mounting plates and configured for an installation of an expansion card, comprising:

a supporting member;

two side boards, connected to two opposite sides of the supporting member, respectively, and detachably disposed on the two mounting plates, respectively;

a plurality of partitions, connected to the supporting member and disposed between the two side boards, wherein the plurality of partitions are spaced apart from one another; and at least one expansion cage, disposed on one of the two side boards and the plurality of partitions.

* * * * *